United States Patent [19]

Chiu et al.

[11] Patent Number: 5,470,783
[45] Date of Patent: Nov. 28, 1995

[54] METHOD FOR INTEGRATED CIRCUIT DEVICE ISOLATION

[75] Inventors: Tzu-Yin Chiu, Martinsville, N.J.;
Frank M. Erceg, Bethlehem, Pa.;
Te-Yin M. Liu, Hsin-Chu, Taiwan;
Keneth G. Moerschel, Bethlehem;
Michael A. Prozonic, Germansville,
both of Pa.; Janmye Sung, Warren, N.J.

[73] Assignee: AT&T IPM Corp., Coral Gables, Fla.

[21] Appl. No.: 369,977

[22] Filed: Jan. 9, 1995

Related U.S. Application Data

[63] Continuation of Ser. No. 254,088, Jun. 6, 1994, abandoned.
[51] Int. Cl.$^6$ .................................................. H01L 21/76
[52] U.S. Cl. ............................ 437/72; 437/69; 437/70; 437/73; 437/67; 148/DIG. 50
[58] Field of Search .............................. 437/69, 70, 72, 437/73, 67; 148/DIG. 50

[56] References Cited

U.S. PATENT DOCUMENTS

| | | | |
|---|---|---|---|
| 4,398,992 | 8/1993 | Fang et al. | 437/72 |
| 4,533,429 | 8/1985 | Josquin | 437/69 |
| 4,563,227 | 1/1986 | Sakai et al. | 437/69 |
| 4,923,563 | 5/1990 | Lee | 437/73 |
| 4,986,879 | 1/1991 | Lee | 156/649 |
| 5,229,318 | 7/1993 | Straboni et al. | 437/67 |
| 5,246,537 | 9/1993 | Cooper et al. | 437/69 |
| 5,248,350 | 9/1993 | Lee | 148/33.2 |

FOREIGN PATENT DOCUMENTS

| | | | |
|---|---|---|---|
| 0488625 | 6/1992 | European Pat. Off. | 437/73 |
| 0007146 | 1/1985 | Japan | 437/73 |
| 0062135 | 4/1985 | Japan | 437/73 |
| 0177646 | 9/1985 | Japan | 437/73 |
| 0214536 | 9/1986 | Japan | 437/69 |
| 0099234 | 4/1989 | Japan | 437/73 |

OTHER PUBLICATIONS

W. G. Oldham, "Isolation Technology For Scaled MOS VLSI" *IEDM* 82 pp. 216–219 (1982).

(List continued on next page.)

*Primary Examiner*—Brian E. Hearn
*Assistant Examiner*—T. Dang
*Attorney, Agent, or Firm*—Richard J. Botos

[57] ABSTRACT

An integrated circuit fabrication process for creating field oxide regions in a substrate is disclosed. In the process, masking layers of oxide, nitride and deposited silicon dioxide are formed on the substrate. A pattern that defines the field oxide regions in the substrate is introduced into the substrate through these masking layers. The field oxide region is bordered by steep sidewalls in a portion of the substrate and the masking layers overlying the substrate. A thin layer of oxide is grown on the exposed portion of the substrate, and a conformal second layer of nitride followed by a conformal layer of a polycrystalline material are formed over the substrate/mask structure. The polycrystalline layer is selectively removed, so that the only portion of the polycrystalline material that remains on the structure is the portion covering the sidewalls. The exposed portions of the second nitride layer are then removed, leaving only those portions of the second nitride layer that are interposed between the polycrystalline material and the sidewalls on the substrate surface. The remaining portions of the polycrystalline material on the surface of the structure are then removed. The field oxide is then grown on the field oxide region of the substrate. The portions of the second nitride layer on the sidewalls are lifted and bent as the oxide is grown. The lifting and bending of the second nitride layer forms grooves in the field oxide as it is grown. The remaining layers of the mask are then removed. A thin layer of oxide is then grown or deposited on the surface of the substrate. A layer of nitride with a thickness that is at least one-half the width of the grooves in the field oxide is deposited on the substrate surface. The nitride layer is then removed except for that portion of the nitride in the grooves.

10 Claims, 3 Drawing Sheets

OTHER PUBLICATIONS

K. Y. Chiu, et al. "A Bird's Beak Free Local Oxidation Technology Feasible for VLSI Circuits Fabrication" *IEEE Trans. on Electron Devices*, vol. ED–29, No. 4, pp. 536–540 (1982).

K. Y. Chiu, et al. "The Sloped–Wall SWAMI—A defect–Free Zero Bird's–Beak Local Oxidation Process for Scaled VLSI Technology" *IEEE Trans. on Electron Devices*, vol. ED–30, No. 11, pp. 1506–1511 (1983).

R. C. Y. Fang et al. "Defect Characteristics and Generation Mechanism in a Bird Beak Free Structure by Sidewall Masked Technique" *J. Electrochem. Soc.* pp. 190–196 (1983).

H–H. Tsai, et al. "A New Fully Recessed–Oxide (FUROX) Field Isolation Technology for Scaled VLSI Circuit Fabrication" *IEEE Electron Device Letters*, vol. EDL–7, No. 2, pp. 124–126 (1986).

D. Kahng, et al. "A Method for Area Saving Planar Isolation Oxides Using Oxidation Protected Sidewalls" *J. Electrochem. Soc.*, pp. 2468–2471, (1980).

K. Y. Chiu et al. "The SWAMI—A Defect Free And Near–Zero Bird's–Beak Local Oxidation Process and Its Application In VLSI Technology" *IEDM* 82, pp. 24–227 (1982).

C. W. Teng, et al. "Optimization of Sidewall Masked Isolation Process" *IEEE Trans. on Electron Devices*, vol. ED–32, No. 2, pp. 124–131 (1985).

METHOD FOR INTEGRATED CIRCUIT DEVICE ISOLATION

This application is a continuation of Ser. No. 254,088 filed Jun. 6, 1994 now abandoned.

TECHNICAL FIELD

The invention relates to the field of semiconductor device fabrication and in particular to those processes for device fabrication in which a silicon dioxide layer is formed between active regions of a silicon substrate.

BACKGROUND OF THE INVENTION

In processes for fabricating semiconductor devices such as integrated circuits, the surface of the semiconductor substrate or wafer is typically divided into regions where active devices and substrate embedded interconnects are to be formed, and other regions of dielectric which electrically separate these active regions. The dielectric regions are typically silicon dioxide and these regions are typically referred to as the field oxide. Many techniques for the formation of the field oxide have been proposed. One technique that is commonly used is the localized oxidation of silicon (LOCOS). In the LOCOS technique, the active regions of the silicon substrate are masked by a silicon nitride layer, while the field oxide regions are thermally oxidized to form a field dielectric region. Although the LOCOS technique is commonly used, there are deficiencies in the current technique which reduce yield or performance in the final product.

One deficiency is commonly known as the bird's beak problem, wherein the field oxide extends under the masking nitride layer to consume some of the usable active area. Additional problems routinely encountered with known field oxide formation processes include stress induced dislocations at the edges of the active regions, and the presence of a relatively nonplanar surface in or adjacent the fully formed field oxide. The nonplanar recesses or notches at the edges of the active region often degrade subsequently formed gate oxide, which can trap conductive layer residuals creating short circuit paths. Although the problems associated with thermal oxide growth are avoided by depositing the field oxide on the substrate, it is advantageous not to have the entire thickness of the field oxide above the substrate surface. Consequently, improved processes for the thermal growth of the field oxide are sought.

The importance of overcoming the various deficiencies noted above is evidenced by the extensive technological development directed to the subject, as documented by the relevant patent and technical literature. Relevant technical literature includes the following articles: Oldham, et al., "Isolation Technology For Scaled MOS VLSI" IEDM 82, pages 216–219 (1982); Chiu, et al., "A Bird's Beak Free Local Oxidation Technology Feasible For VLSI Circuits Fabrication" IEEE Transactions on Electron Devices, pages 536–540 (April 1982); Chiu et al., "The Sloped-Wall SWAMI-A Defect-Free Zero Bird's Beak Local Oxidation Process For Scaled VLSI Technology" IEEE Transactions on Electron Devices, pages 1506–1511 (November 1983); Fang et al., "Defect Characteristics and Generation Mechanism In a Bird Beak Free Structure By Sidewall Masked Technique" Journal of Electrochemical Society, pages 190–196 (1983); Tsi et al., "A New Fully Recessed-Oxide (FUROX) Field Isolation Technology For Scaled VLSI Circuit Fabrication" IEEE Electron Device Letters, pages 124–126 (February 1986); Kahng et al., "A Method For Saving Planar Isolation Oxides Using Oxidation Protected Sidewalls" Journal of Electrochemical Society, pages 2468–2471 (November 1980); Chiu et al., "The SWAMI-A Defect Free And Near-Zero Bird's-Beak Local Oxidation Process And Its Application In VLSI Technology" IEDM 82, pages 224–227 (1982); Inuishi et al., "Defect Free Process Of A Bird's Beak Reduced LOCOS" Abstract No. 273 in an unknown publication, pages 40–410 (1985 or later date); Teng et al., "Optimization of Sidewall Masked Isolation Process" IEEE Journal of Solid-State Circuits, pages 44–51, (February 1985). The diversity and complexity of the various technical approaches substantiates the difficulty and importance of developing a commercially viable process for isolating active regions in a silicon substrate during the fabrication of integrated circuits.

Another solution to the bird's beak problem is proposed in U.S. Pat. Nos. 4,986,879, 4,923,563 and 5,248,350 to Lee. In these processes, a layer of silicon nitride is formed on the sidewalls of a trench formed in a substrate with masking layers thereover. The sidewalls define the field oxide regions in the substrate. Lee et al., require the silicon nitride layer to have a specified thickness, so that it will be entirely consumed as the oxide is grown in this region.

However, it is difficult to precisely control the thickness of the silicon nitride layer to ensure that it will be entirely consumed in about the same amount of time that it takes to grow the field oxide. If the silicon nitride is consumed before the desired amount of field oxide is grown, the silicon that is laterally adjacent the sidewalls is left unprotected during the remaining portions of the oxide growth. The silicon in these adjacent regions will then be oxidized, which reduces the device active area. If the silicon nitride is not totally consumed when the desired amount of field oxide is grown on the substrate, the remaining amount of silicon nitride must be removed before further processing. Accordingly, further improvement in the LOCOS process is desired.

SUMMARY OF THE INVENTION

In the process of the present invention, field oxide regions are formed between active regions in a semiconductor substrate. In the present process, the field oxide is selectively grown on certain areas of the substrate by forming a mask over areas of the substrate on which the field oxide is not desired. The oxide is grown and the mask is removed without unacceptably extending the oxide into the device active area. In the present process, grooves or notches that are formed in the substrate at the boundary between the field oxide and the mask are filled in with an insulating material so that these grooves or notches do not trap conductive residuals.

In the present process, a mask made of multiple layers of material is formed on the surface of a semiconductor substrate such as a silicon wafer. The mask is formed by growing a first layer of silicon dioxide (pad oxide) on the substrate surface. The pad oxide is thermally grown using conventional techniques to a thickness of about 5 to about 100 nm. A first layer of silicon nitride (silicon nitride I) is then formed over the pad oxide using conventional techniques. It is advantageous if a layer of polysilicon is formed above the pad oxide layer before the layer of silicon nitride I is formed thereover. A layer of silicon dioxide is then deposited over the silicon nitride I layer. The silicon dioxide is deposited using conventional techniques such as chemical vapor deposition (CVD) or a plasma deposition. Such techniques are well known to those skilled in the art. For example silicon dioxide is deposited from a plasma enhanced tetraethyl orthosilicate (TEOS). The deposited oxide layer has a thickness of about 10 to about 100 nm. The semiconductor substrate with layers of various materials thereon is referred to as the semiconductor structure.

A pattern is then formed over the uppermost deposited oxide layer. The pattern is formed in a standard resist material. Resist materials suited for this particular process are well known to those skilled in the art. The pattern is transferred into the successive layers of the mask and into a portion of the semiconductor substrate using conventional etching techniques. As a result, trenches are formed through the mask and into the underlying semiconductor substrate. It is advantageous if the etch proceeds about 0.1 to about 0.3 microns below the interface between the pad oxide layer and the semiconductor substrate.

The pattern is formed and transferred into the underlying layers using standard lithographic techniques. The resist is then removed. A thin layer of oxide is then grown on the exposed portion of the semiconductor surface using a conventional thermal oxidation process. The thickness of this layer of oxide is a matter of design choice. It is advantageous if the thickness is about 5 nm to about 50 nm.

A blanket second layer of silicon nitride (silicon nitride II) is then formed on the surface of the semiconductor structure. The thickness of the silicon nitride II layer is about 10 nm to 300 nm. The silicon nitride layer is then selectively removed so that only those portions of the silicon nitride II layer on the sidewalls of the trenches remain.

To selectively retain the silicon nitride II layer only on the sidewalls, a blanket polysilicon film is first deposited onto the surface of the semiconductor structure. It is advantageous if the blanket polysilicon film conforms to the trench, but does not fill the trench. Therefore, the thickness of the polysilicon film is less than one-half the width of the trench. The polysilicon film is then etched anisotropically using standard etching techniques, until the only portion of the polysilicon remaining on the surface is that portion of the polysilicon that is adjacent to the sidewalls. The surface is then subjected to a nitride wet etch to remove the exposed portions of the silicon nitride II layer. The portion of the silicon nitride II layer on the sidewalls is not removed because it is covered by the remaining polysilicon. The portion of the polysilicon layer remaining on the sidewalls is then removed using a standard wet etch technique. Then the deposited silicon dioxide layer on top of the semiconductor structure and the exposed portion of the oxide layer at the bottom of the trench are removed. A standard wet etch technique is used to effect this removal.

Silicon dioxide is then thermally grown on the exposed silicon at the bottom of the trench to form the field oxide. It is advantageous if the field oxide has a thickness of about 600 nm to about 1000 nm. The portions of the silicon nitride II layer remaining on the sidewalls are lifted and bent as the oxide is thermally grown. This lifting and bending of the nitride layer causes the formation of grooves in the resulting oxide layer. The remaining portion of the nitride II layer, and the layers of silicon nitride I, polysilicon (if present), and pad oxide are then removed.

A sacrificial layer of oxide is then thermally grown on the exposed portions of the silicon substrate. It is advantageous if this layer of sacrificial oxide has a thickness of about 15 nm to about 60 nm. A blanket layer of silicon nitride or silicon dioxide is then deposited over the surface of the substrate using a chemical vapor deposition. It is advantageous if the silicon nitride or oxide layer has a thickness of about 100 nm to about 300 nm. It is advantageous if the layer is a silicon nitride layer. The layer is then overetched to remove the layer from the surface of the substrate. However, the grooves in the field oxide remain filled with silicon nitride or silicon dioxide material. Since these materials are insulators, a short circuit will not result between circuits formed on the substrate that are connected to the groove.

DESCRIPTION OF A PREFERRED EMBODIMENT

Figure 1:
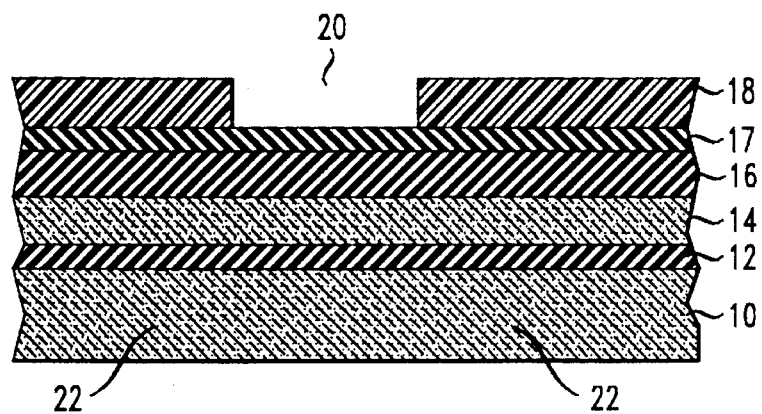
FIGS. 1–5 are cross-sectional schematic representations of an integrated circuit substrate at various stages in the fabrication sequence prior to field oxide growth.

FIG. 1 shows a silicon substrate 10, a pad oxide layer 12 (silicon dioxide) overlying substrate 10, a polysilicon I layer 14 overlying pad oxide layer 12, a silicon nitride I layer 16 overlying polysilicon I layer 14, a second silicon dioxide layer 17 overlying silicon nitride I layer 16, and topped off with a patterned photoresist 18.

To create the structure in FIG. 1, the silicon substrate 10 is first thermally oxidized to form a pad oxide layer 12 having a nominal thickness of about 5 nm to about 100 nm. Techniques for the thermal oxidation of silicon are well known. Typically, oxide is grown at a temperature of about 800° C. to about 1000° C. in an atmosphere containing $O_2$ and either $H_2O$ or $H_2$.

The polysilicon I layer 14 is then formed to a nominal thickness of 30–150 nm over the pad oxide layer 12 by a low pressure chemical vapor deposition (LPCVD) process or the like. The polysilicon I layer 14 is optional, however its presence is advantageous because it prevents a sharp corner (i.e. bird's beak) from forming between the active regions and the field oxide regions in the substrate from exposure in the event of an overetch during subsequent processing. The silicon nitride I layer 16 is preferably formed over the polysilicon I layer 14 to a nominal thickness of 10–250 nm by LPCVD.

The second silicon dioxide layer 17 is then deposited over the silicon nitride I layer 16 using an LPCVD or plasma enhanced deposition process. For example, the second silicon dioxide layer is deposited using a plasma enhanced tetraethylorthosilicate (TEOS). These deposition techniques are well-known to those skilled in the art. The photoresist 18 is then deposited and lithographically patterned to cream a photoresist (PR) mask pattern exposing the deposited silicon dioxide layer 17 at opening 20. Opening 20 corresponds generally to the field oxide formation region between active regions 22 in substrate 10.

Figure 2:
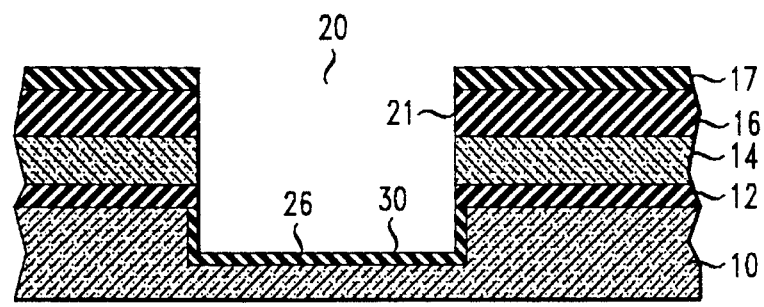

To obtain the structure depicted in FIG. 2, the structure in FIG. 1 is anisotropically etched using a conventional reactive ion etching (RIE) process to remove the unmasked portion of the deposited silicon dioxide layer 17, the corresponding segments of the underlying nitride I layer 16, the underlying polysilicon I layer 14, the underlying pad oxide layer 12, and a portion of the corresponding segment of the underlying substrate 10. It is advantageous if a recess of about 0.1 to about 0.3 microns deep is formed in the substrate 10. The opening 20 created by the selective etch through deposited silicon dioxide layer 17, nitride I layer 16, polysilicon I layer 14, pad oxide layer 12, and a portion of the substrate 10 defines a region for the growth of the field oxide, which occurs later in the process sequence.

Opening 20 is in the form of a trench through the multiple layers of material. Opening 20 is bounded by a vertical sidewall surface 21 and a horizontal adjoining bottom surface 30. Preferably, sidewall surface 21 is normal to bottom surface 30 as well as the layers of pad oxide 12, polysilicon I 14, nitride I 16, and the deposited silicon dioxide layer 17. The photoresist layer 18 is then stripped from the surface of the structure using conventional techniques.

A layer of oxide 26 is thermally grown on the exposed portion of the substrate 10 at the bottom of the opening 20. It is advantageous if this layer has a thickness of about 5 nm to about 50 nm. This layer of oxide protects the silicon underneath during subsequent processing. If desired, dopant is implanted into selected regions of the structure pictured in FIG. 2. The steps for the selective introduction of dopant are described in U.S. Pat. Nos. 5,248,350, 4,923,563, and 4,986,879 to Lee, the disclosures of which are incorporated by reference into this disclosure. The steps for the selective introduction of dopant are not described in detail in this disclosure.

Figure 3:
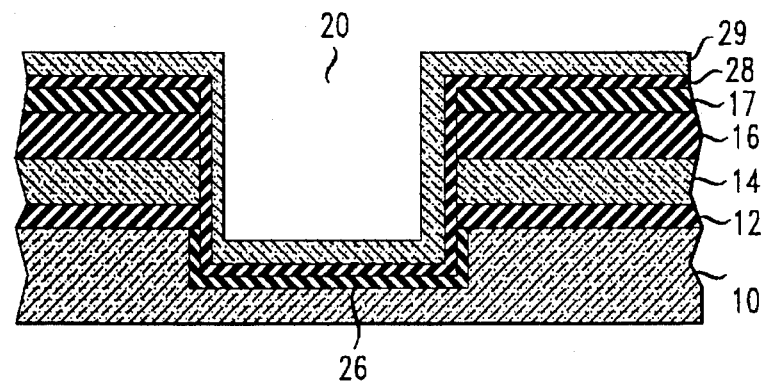

As shown in FIG. 3, a second silicon nitride layer II 28 is deposited by an LPCVD process to conformally cover the structure. The thickness of this layer is largely a matter of design choice, and will depend in part upon the size of the opening 20 as well as other design considerations. For example, if the width of the opening 20 is about 1000 nm, it is advantageous if the nitride II layer has a thickness of about 30 nm. A layer of polysilicon II 29 is then deposited by LPCVD. Again, the thickness of the polysilicon II layer 29 is largely a matter of design choice, provided that the polysilicon II layer does not completely fill the opening 20. For example, it is advantageous if the polysilicon II layer 29 has a thickness of about 50 nm to about 400 nm for the opening size specified above.

Figure 4:
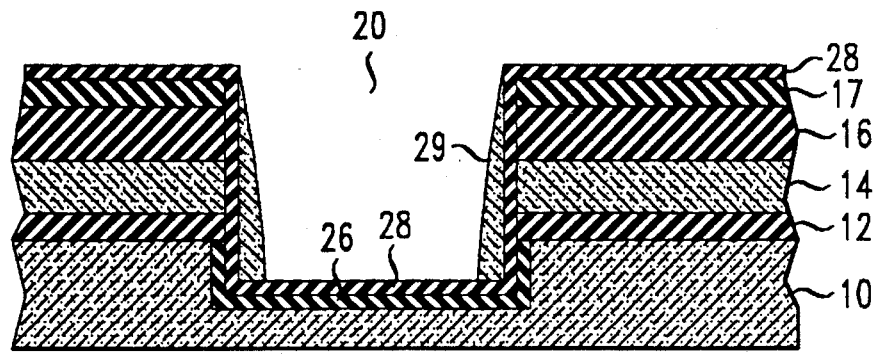
Figure 5:
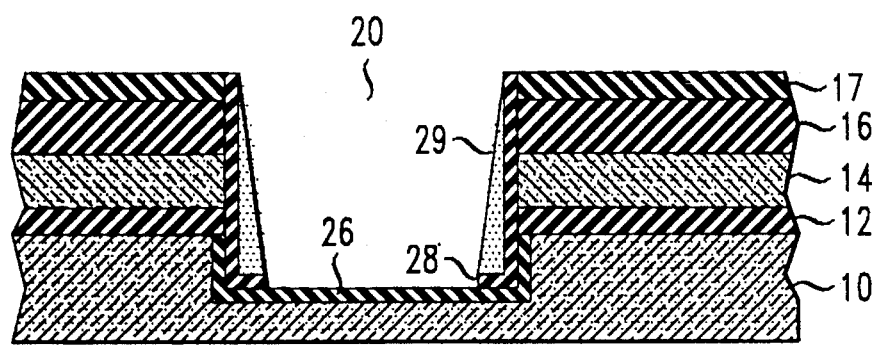

The structure depicted in FIG. 3 is then subjected to etching conditions that remove the polysilicon II layer 29 preferentially from the horizontal surfaces. A standard RIE process is used for this purpose. The remaining portions of the polysilicon II layer 29, hereinafter referred to as polysilicon spacers 29, are depicted in FIG. 4. The nitride II layer 28 is then removed by a conventional nitride wet etching process (e.g. a phosphoric acid wet etchant). The deposited oxide layer 17 acts as an etch stop for both the polysilicon II and nitride II etches. The resulting structure is depicted in FIG. 5.

Figure 6:
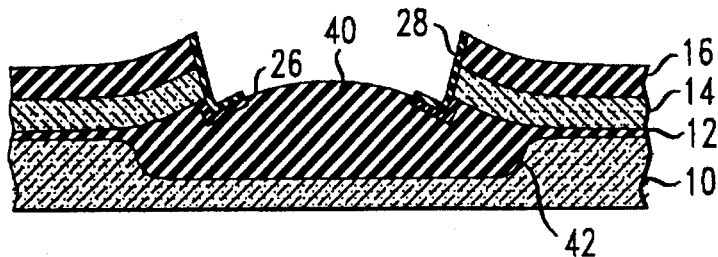
FIG. 6 schematically illustrates, in cross-section, an integrated circuit device during field oxide growth.

The polysilicon spacers 29 are then removed using a standard wet etchant for polysilicon (e.g. a KOH wet etchant). The structure is then subjected to an oxide wet etch (e.g. an HF wet etchant) to remove the deposited oxide layer 17. This also removes the exposed portion of the thin layer of oxide 26 at the bottom of the opening 20. Silicon dioxide 40 is then grown on the exposed portions of the silicon substrate 10 using a standard thermal oxidation process. As illustrated in FIG. 6, as the silicon dioxide 40 is grown, the silicon in the sidewalls 21 of the opening 20 is gradually exposed which leads to oxidation of the silicon in the lateral direction in addition to the vertical direction. Because the nitride II layer 28 masks the sidewall during the growth of the oxide, and a portion of the oxide layer 26 remains under the nitride II layer 28, grooves 31 are formed in the field oxide. The boundaries of the discrete areas of silicon dioxide 12, 26 and 40 blend together during the growth of the field oxide 40.

The exposed substrate 10 and sidewall silicon nitride II 28 are oxidized to a degree that effectuates the lifting and bending of the sidewall silicon nitride II 28. The field oxide is grown in a conventional wet oxidation environment of $H_2O+O_2$ or $H_2+O_2$ at a nominal temperature of about 800° C. to about 1000° C. at a pressure of about 1 atm to about 24 atm for a nominal time of about 10 minutes to about 2 hours. The field oxide is also grown in a dry environment of $O_2$ at high pressure. As the field oxide growth progresses to the structure shown in FIG. 6, the former sidewall nitride II layer 28 is fully lifted and bent.

FIG. 6 also illustrates that the lifting of the residual sidewall silicon nitride II 28 exposes the relatively thick pad oxide 12 and the polysilicon layer 14 near the end of the oxidation step. Pad oxide 12 then serves as a path for relieving volumetric increase stresses in field oxide 40 proximate to the silicon substrate corners 42; corners which are otherwise more susceptible to stress induced dislocations. As the field oxide growth continues into the final stage depicted in FIG. 6, it is easier for the oxygen species to reach silicon substrate corners 42 and to oxidize the silicon in these corners. The accentuated oxidation rate at these corners 42 causes them to have the relatively large radius and smooth contour depicted in FIG. 6 as well as reduced local stress. The relatively thick pad oxide layer 12 provides a yielding path for the relief of localized stresses, which path supplements the vertically directed movement and relief in the region 46. The oxidation of the substrate and lifting of the sidewall nitride II 28 (FIG. 6) continues until the oxidized portion of the substrate reaches a thickness of about 600 to 1000 nm. It is advantageous if the field oxide has a thickness of about 800 nm. Since the field oxide is thermally grown, about one-half of the oxide growth is below the substrate surface and the other one-half is above the substrate surface.

The structure is then subjected to a wet etch (e.g., an HF etchant) to remove oxynitride formed on the surface of nitride I layer 16 during the thermal oxidation process. Then the structure is subjected to a nitride wet etch using, for example, a phosphoric acid etchant, to remove the remaining nitride I layer 16 and the sidewall nitride II layer 28. The polysilicon I layer 16 is then removed by a wet etch using, for example, a KOH etchant. Then, the pad oxide layer 12 is removed by a wet etch using, for example, an HF etchant. Such etching is difficult to control precisely and overetching of the field oxide easily occurs. If the corners 42 are exposed during the overetch, the resulting device will likely have reliability problems. However, as illustrated by FIG. 6, corners 42 are well recessed in the field oxide layer 40 because of the lateral growth of the field oxide into the area over these corners and will not likely be exposed by overetching.

Figure 7:
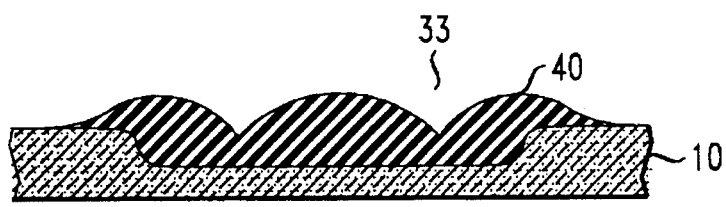
FIGS. 7–9 schematically illustrate, in cross-section, selected stages leading up to and including the formation of the gate oxide.

The structure that results after the layers 12, 14, and 16 are removed is illustrated in FIG. 7. Grooves 33 are present in the field oxide 40. If these grooves are filled with polysilicon or some other semiconductive (or conductive) material during subsequent processing, the grooves have the potential to cause short circuiting between devices formed over these grooves. In the present process, these grooves are filled with an insulating material to prevent the grooves from creating a short circuit.

Figure 8:
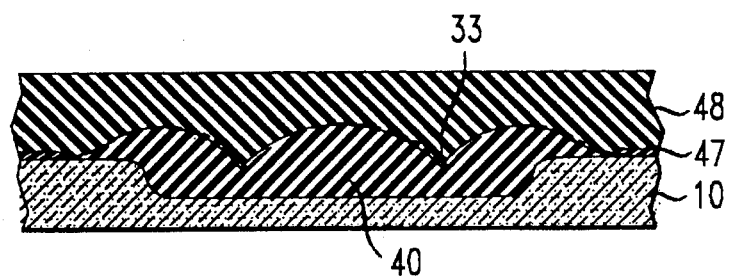

As depicted in FIG. 8 a thin layer of protective oxide 47 is first grown over the exposed portions of the silicon substrate 10, using thermal oxidation process conditions that were previously described. A layer of silicon nitride 48 is then deposited over the substrate 10 and the field oxide 40. The silicon nitride is deposited using a conventional process such as LPCVD. It is possible to deposit silicon dioxide instead of silicon nitride. However, silicon nitride is preferred for subsequent processing.

Figure 9:
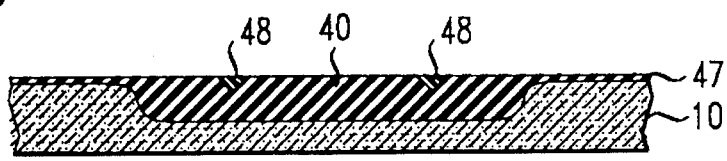

It is advantageous if the thickness of the silicon nitride layer 48 is at least one-half the width of the grooves 33. For example, if the grooves are 0.5 µm wide, the silicon nitride layer is at least 0.25 µm thick. This ensures that the groove is filled with the silicon nitride. As illustrated in FIG. 9, all of the silicon nitride layer 48, except that portion that fills the grooves, is then removed. The silicon nitride layer 48 is removed by using an etchant such as phosphoric acid. The thin layer of oxide 47 protects the silicon substrate surface 10 during this etch.

The above is a description of one specific embodiment of the present invention. One skilled in the art will recognize that the description may be modified in many ways that are still within the scope of the claimed invention.

We claim:

1. A process for forming field oxide regions between active regions in a semiconductor substrate comprising:

forming over a semiconductor substrate with active regions therein a pad oxide layer;

forming over the pad oxide layer a first silicon nitride layer;

depositing a layer of silicon dioxide with a thickness of about 10 nm to about 100 nm over the first silicon nitride layer, thereby forming a semiconductor substrate structure;

forming a resist mask over the deposited oxide layer, the resist mask covering over those areas of the semiconductor substrate structure that correspond to the device active regions and not covering over those areas of the semiconductor substrate structure that correspond to field oxide regions in the semiconductor substrate;

anisotropically etching through the layers of deposited silicon dioxide, silicon nitride and pad oxide in the areas of the semiconductor substrate structure that are not covered by the mask and into the substrate to define field oxide regions with substantially vertical sidewalls in the semiconductor substrate structure;

forming a layer of silicon dioxide on the exposed surface of the substrate in the field oxide region;

forming a conformal second silicon nitride layer over the surface of the semiconductor substrate structure;

forming a conformal layer of polycrystalline silicon over the second silicon nitride layer, the polycrystalline silicon layer having a thickness that is less than about one-half of the field oxide region defined by the substantially vertical sidewalls;

forming a sidewall mask of the second silicon nitride layer on the semiconductor substrate structure sidewalls by anisotropically etching the horizontally disposed portions of the polycrystalline silicon layer, removing the exposed portions of the second silicon nitride layer, removing the remaining portions of the polycrystalline silicon layer adjacent to the sidewalls, removing the deposited silicon dioxide layer;

thermally oxidizing the exposed portions of the semiconductor to grow a field oxide in the field region of the semiconductor substrate, thereby lifting and bending the silicon nitride sidewall mask from the end of the mask nearest the silicon substrate surfaces and thereby forming grooves in the field oxide;

removing the first layer of nitride from the semiconductor substrate;

removing the pad oxide layer from the semiconductor substrate;

forming a thin layer of silicon dioxide on the active regions of the substrate;

forming a layer of silicon nitride over the surface of the substrate, wherein the thickness of the silicon nitride layer is at least one-half the width of the groove formed in the field oxide; and removing the silicon nitride from the substrate surface without removing the silicon nitride from the grooves in the field oxide.

2. The process of claim 1 wherein the pad oxide is thermally grown to a thickness of about 5 to about 100 nm.

3. The process of claim 1 further comprising forming a layer of polycrystalline silicon over the pad oxide layer before the layer of silicon dioxide is deposited thereover.

4. The process of claim 3 wherein the polycrystalline layer overlying the pad oxide layer has a thickness of about 30 nm to about 150 nm.

5. The process of claim 1 wherein the anisotropic etch proceeds about 0.1 microns to about 0.3 microns into the substrate.

6. The process of claim 1 wherein the second silicon nitride layer has a thickness that is substantially less than one-half the distance between opposing substantially vertical sidewalls that define a field oxide region.

7. The process of claim 6 wherein the polycrystalline layer that is deposited over the second silicon nitride layer has a thickness that is substantially less than one-half the distance between opposing substantially vertical sidewalls that define a field oxide region.

8. The process of claim 1 wherein the field oxide is grown to a thickness of about 600 nm to about 1000 nm.

9. The process of claim 1 wherein the thin layer of silicon dioxide formed on the device active regions of the substrate has a thickness of about 15 nm to about 60 nm.

10. The process of claim 1 wherein the thickness of the silicon nitride film formed in the grooves and over the surface of the substrate is about 100 nm to about 300 nm.

* * * * *

UNITED STATES PATENT AND TRADEMARK OFFICE
CERTIFICATE OF CORRECTION

PATENT NO. : 5,470,783
DATED : Nov. 28, 1995
INVENTOR(S) : Tzu-Yin Chiu, et al.

It is certified that error appears in the above-indentified patent and that said Letters Patent is hereby corrected as shown below:

Column 8, line 32, delete "layer of silicon dioxide" and add --first silicon nitride layer--.

Signed and Sealed this

Sixteenth Day of June, 1998

*Attest:*

BRUCE LEHMAN

*Attesting Officer*   *Commissioner of Patents and Trademarks*